US006385761B1

(12) United States Patent
Breid

(10) Patent No.: US 6,385,761 B1
(45) Date of Patent: May 7, 2002

(54) FLEXIBLE WIDTH CELL LAYOUT ARCHITECTURE

(75) Inventor: Duane G. Breid, Lakeville, MN (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/410,405

(22) Filed: Oct. 1, 1999

(51) Int. Cl.[7] .............................................. G06F 17/50
(52) U.S. Cl. ........................... 716/8; 716/3; 716/12; 716/17; 716/18
(58) Field of Search ........................................ 716/1–21

(56) References Cited

U.S. PATENT DOCUMENTS

| | | | | |
|---|---|---|---|---|
| 5,598,347 A | * | 1/1997 | Iwasaki | 716/8 |
| 5,619,420 A | * | 4/1997 | Breid | 716/8 |
| 5,666,288 A | * | 9/1997 | Jones et al. | 716/17 |
| 5,754,826 A | * | 5/1998 | Gamal et al. | 703/14 |
| 5,808,900 A | | 9/1998 | Buer et al. | 716/10 |
| 6,006,024 A | * | 12/1999 | Guruswamy et al. | 716/12 |
| 6,075,934 A | * | 6/2000 | Chiluburi et al. | 716/10 |
| 6,269,466 B1 | * | 7/2001 | Crafts | 716/1 |
| 6,336,207 B2 | * | 1/2002 | Shinomiya et al. | 716/11 |

OTHER PUBLICATIONS

Ahmad et al. ("Integrated scheduling, allocation and module selection for design–space exploration in high–level synthesis", IEE Proceedings on Computers and Digital Techniques, vol. 142, No. 1, Jan. 1995, pp. 65–71).*

* cited by examiner

Primary Examiner—Matthew Smith
Assistant Examiner—Phallaka Kik
(74) Attorney, Agent, or Firm—Westman, Champlin & Kelly

(57) ABSTRACT

The semiconductor cell library of the present invention includes a plurality of semiconductor cell definitions. At least one of the semiconductor cell definitions includes a base cell and at least one derivative cell. The base cell has a logical function and includes a base cell layout pattern of transistors with at least one diffusion. The derivative cell has the same logical function as the base cell and includes a derivative cell layout pattern of transistors with at least on a diffusion region. The diffusion region of the derivative cell layout pattern is expanded in one dimension outwardly from a geometric center of the layout pattern relative to the diffusion region of the base cell layout pattern.

8 Claims, 5 Drawing Sheets

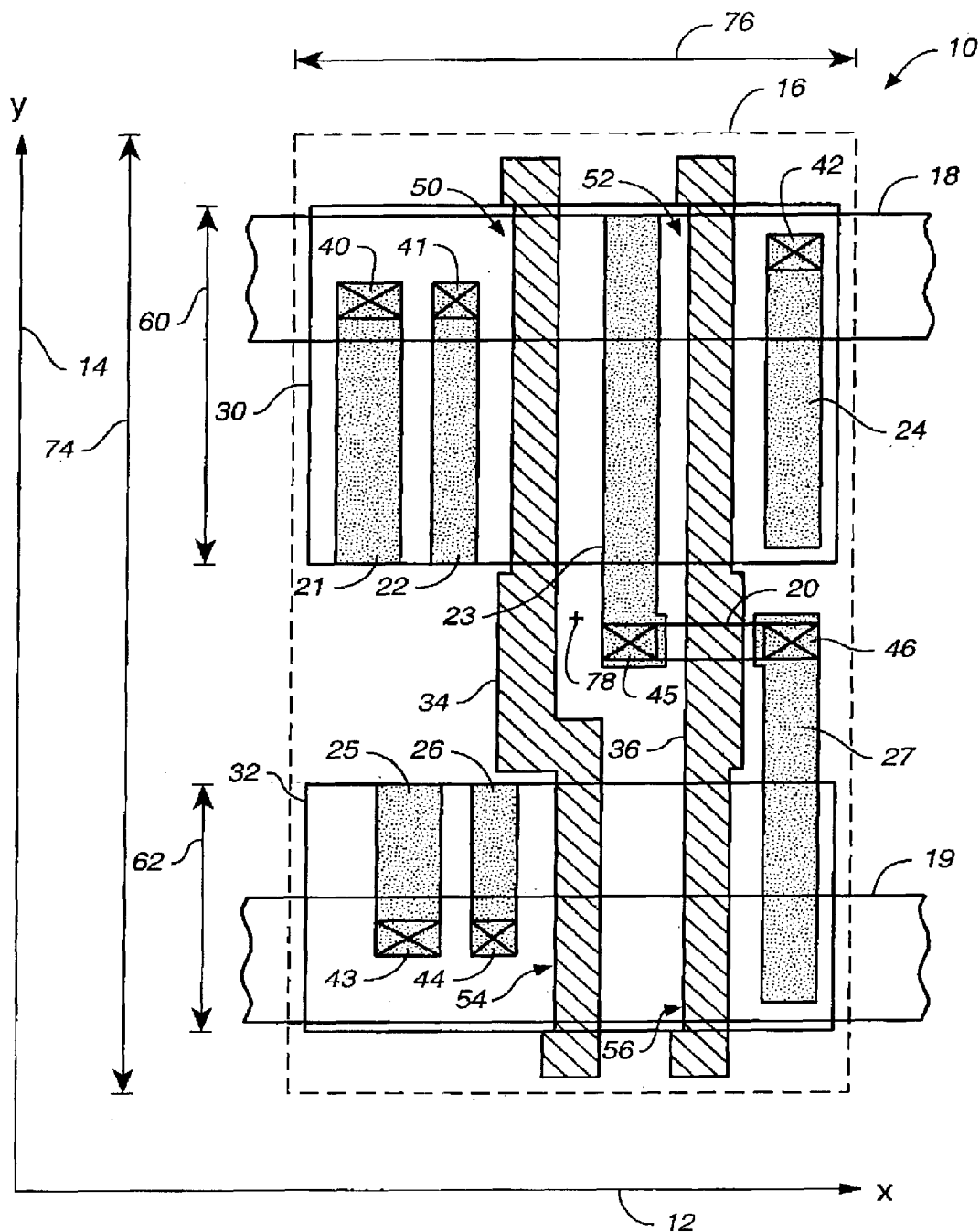
FIG._1

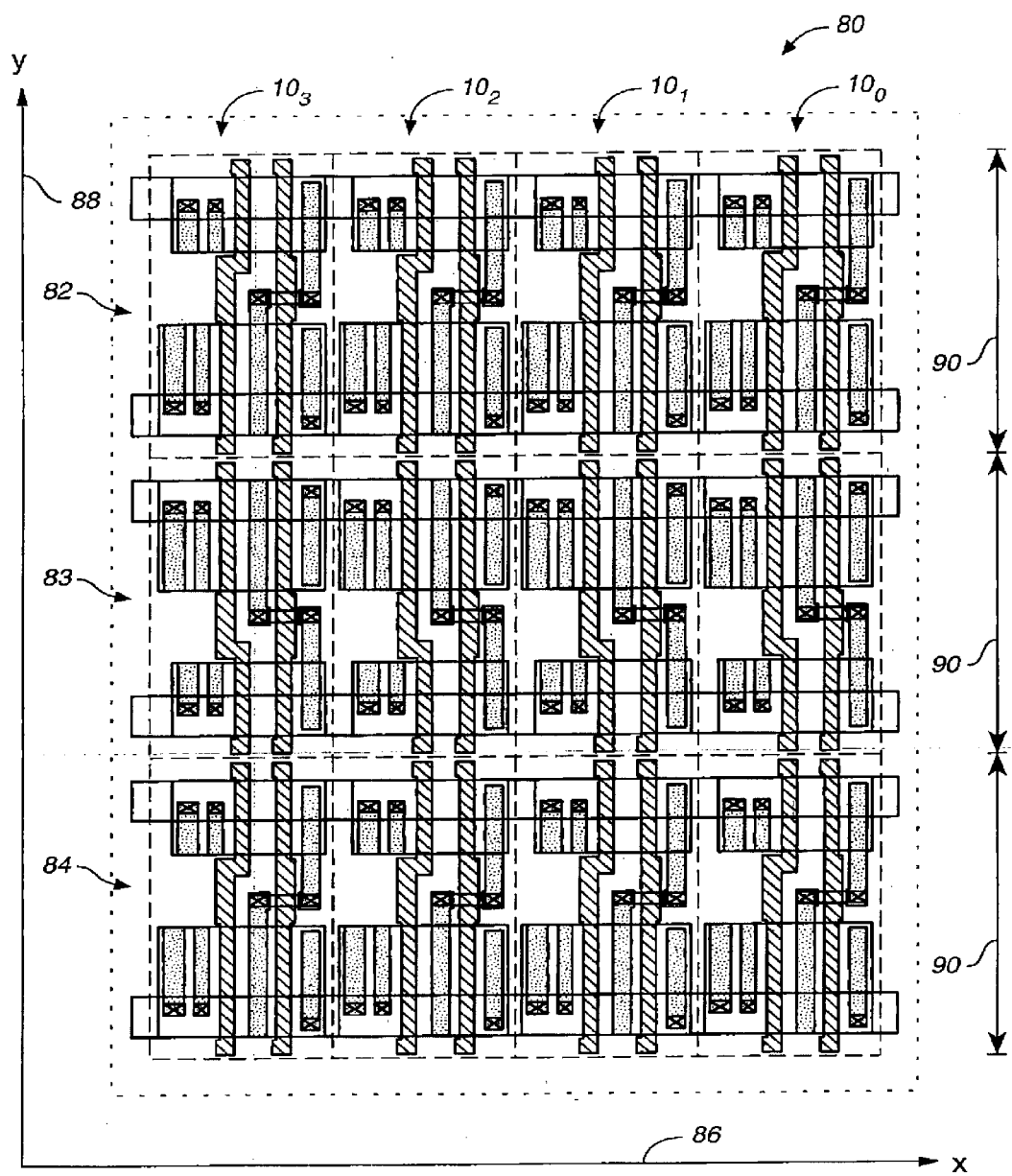
FIG._2

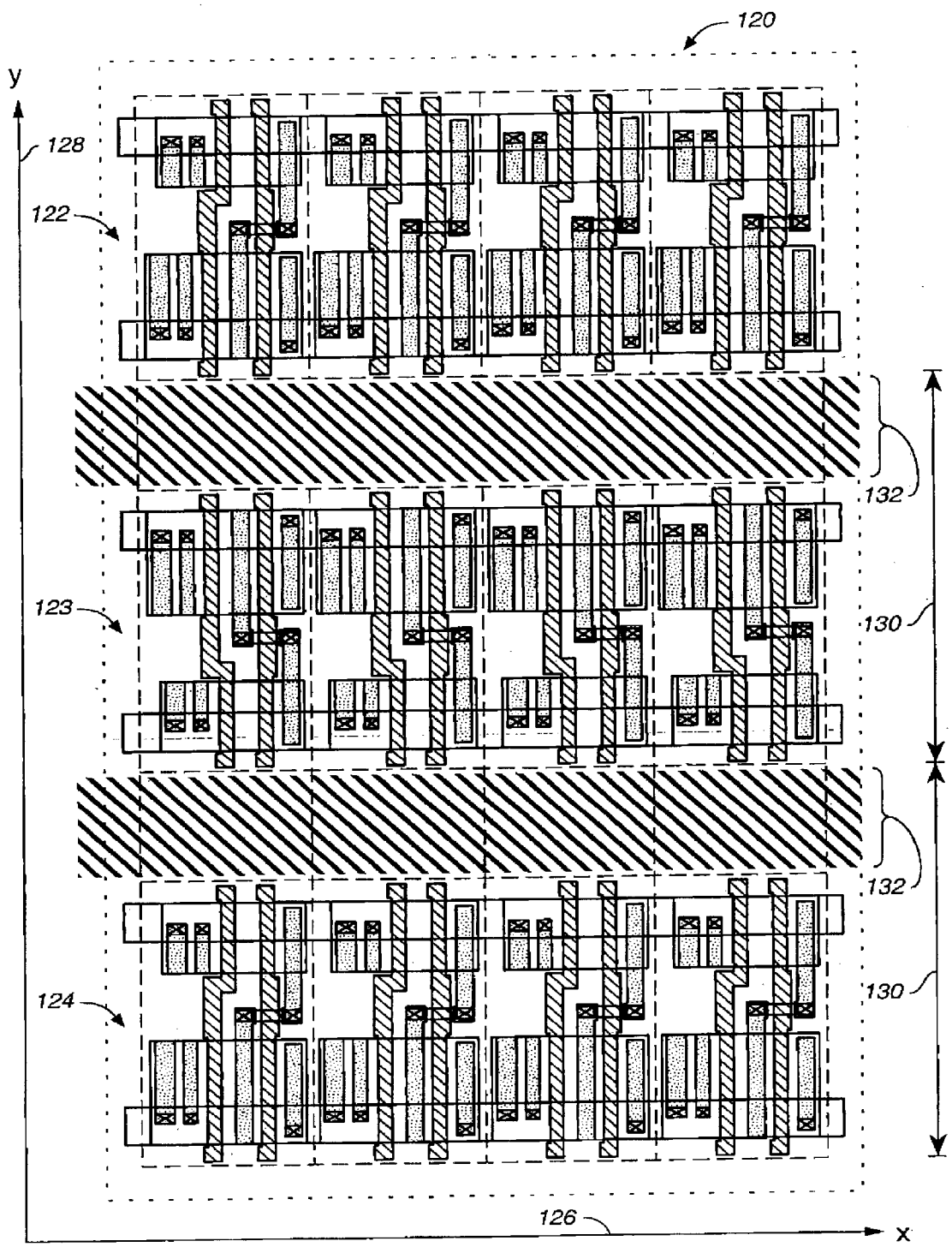
FIG._3

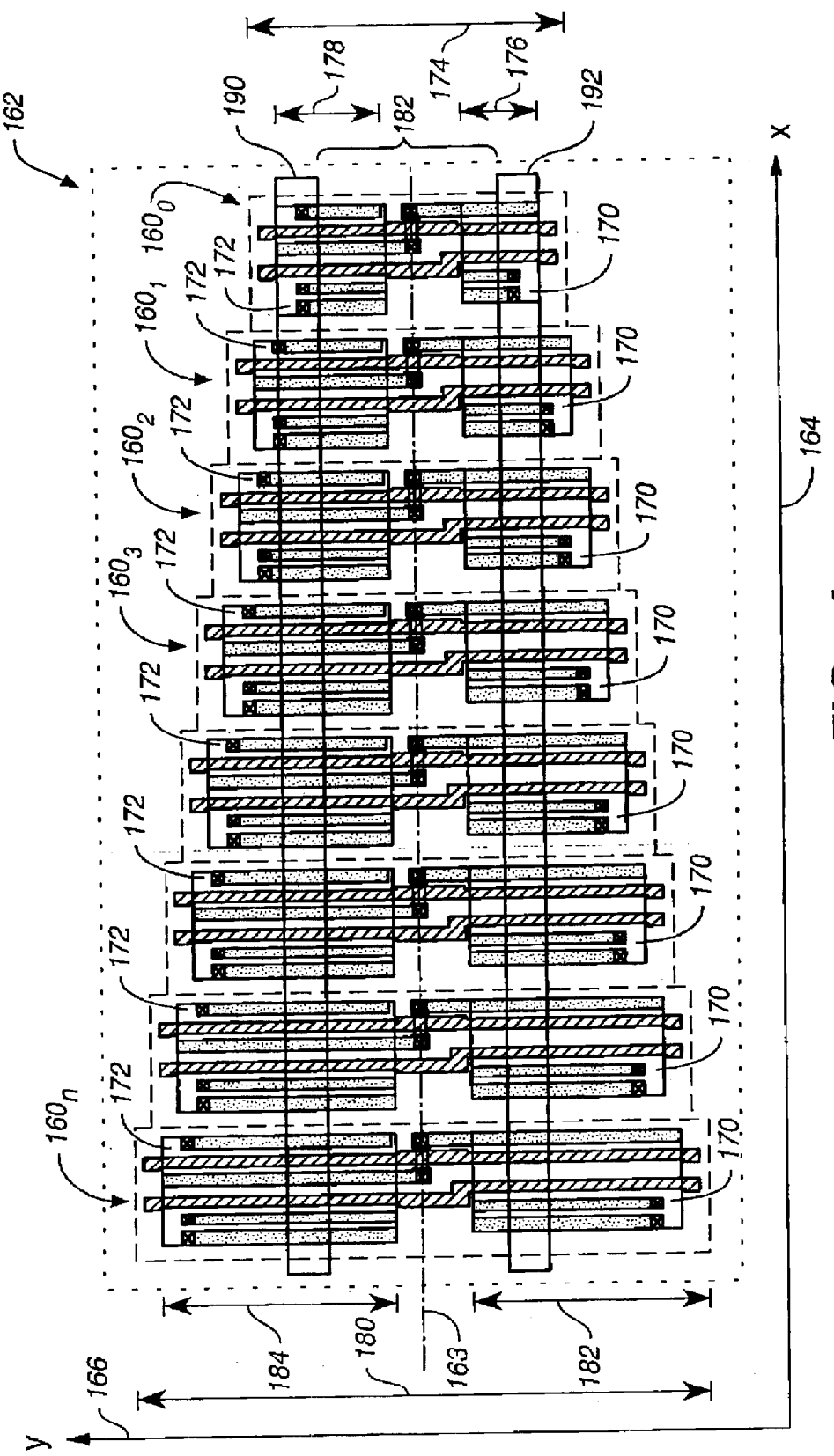
FIG._4

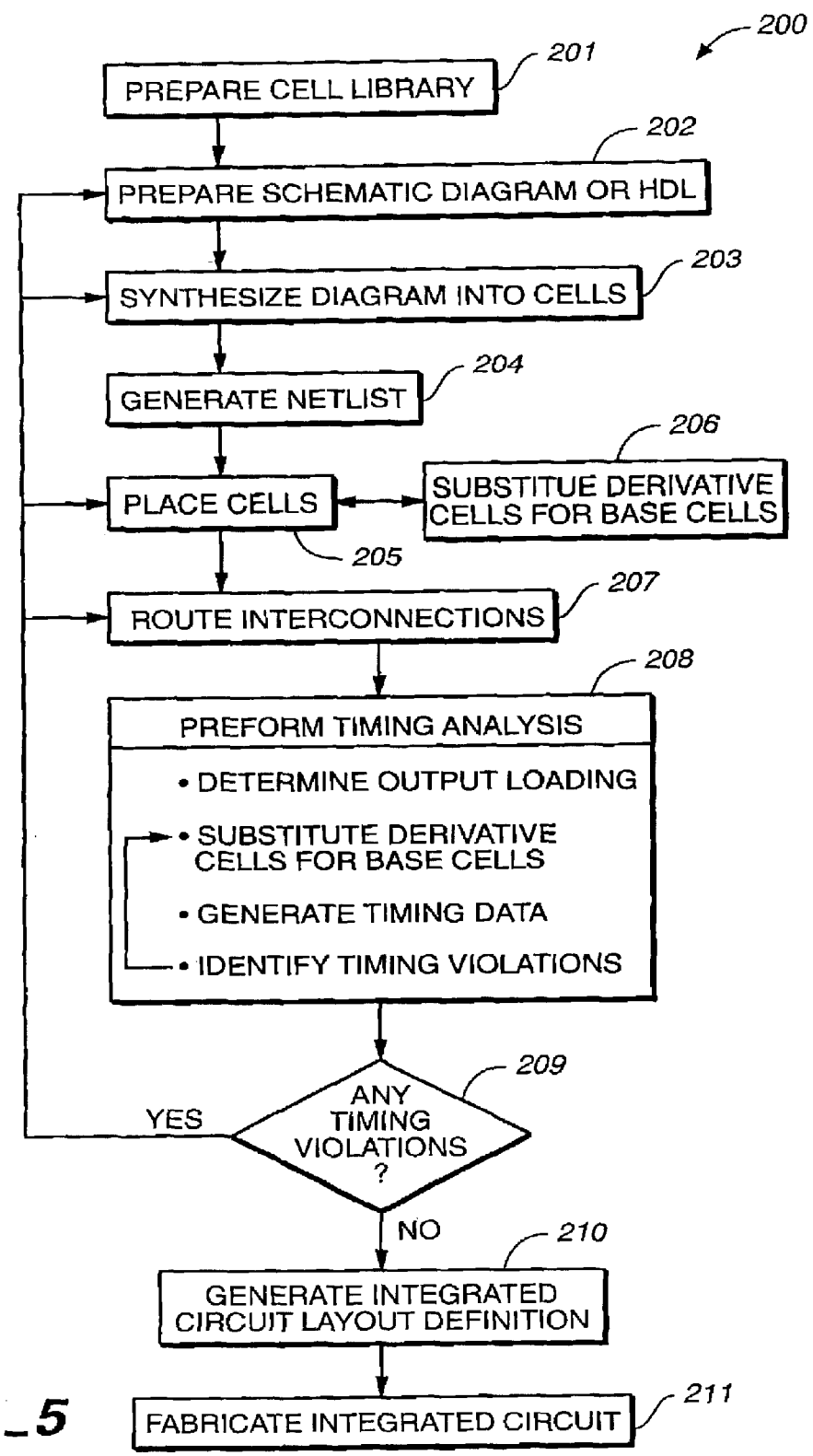
FIG._5

FLEXIBLE WIDTH CELL LAYOUT ARCHITECTURE

BACKGROUND OF THE INVENTION

The present invention relates to a semiconductor cell library for use in a layout process of a semiconductor integrated circuit and, more particularly, to a semiconductor cell library having flexible cell widths.

Semiconductor integrated circuits are designed and fabricated by first preparing a schematic diagram or hardware description language (HDL) specification of a logical circuit in which functional elements are interconnected to form a particular logical function. The schematic diagram or HDL specification is synthesized in to cells of a specific cell library. Each cell corresponds to a logical function unit which is implemented by one or more transistors that are optimized for the cell. A typical cell library may have several identical cells for each logical function unit, with each cell having a different, predetermined output drive strength. Higher drive strength is often achieved by placing additional drive transistors in parallel with one another within the cell. The logic designer selects the cells according to the number of loads that are attached to the cell, as well as the estimated interconnection required for routing.

The cells in the library are defined by cell library definitions. Each cell library definition includes cell layout definitions and cell characteristics. The layout definition includes a layout pattern of the transistors in the cell, geometry data for the cell's transistors and cell routing data. The cell characteristics include a cell propagation delay and a model of the cell's function. The propagation delay is a function of the internal cell delay and the output loading of the cell.

Most cell libraries have cells that conform to a single cell height to allow abutment of adjacent cells into rows without creating design rule violations. The cell height is selected to achieve a desired balance between transistor performance and density for the integrated circuit. If the cell height is short, the transistors in the cells are smaller and have less drive strength. However, the rows of cells can be place closer together (i.e., at a smaller row pitch). This allows more transistors to be placed in a given area. Thus, a short cell height provides higher density, with lower performance. If the cell height is tall, the transistors in each cell are larger and have greater drive strength. However, the rows of cells must be placed farther apart such that fewer transistors can be placed in a given area. Thus, a tall cell height provides lower density, with higher performance. As a result, a single library of cells is often a compromise between performance and density.

Some application specific integrated circuit (ASIC) suppliers have provided multiple cell libraries, with each cell library being tuned to a specific performance and density. However, this increases the resources and time required to support the cell libraries. Improved cell libraries are desired that provide more optimal support of both high density and high performance.

SUMMARY OF THE INVENTION

The semiconductor cell library of the present invention includes a plurality of semiconductor cell definitions. At least one of the semiconductor cell definitions includes a base cell and at least one derivative cell. The base cell has a logical function and includes a base cell layout pattern of transistors with at least one diffusion region. The derivative cell has the same logical function as the base cell and includes a derivative cell layout pattern of transistors with at least one a diffusion region. The diffusion region of the derivative cell layout pattern is expanded in one dimension outwardly from a geometric center of the layout pattern relative to the diffusion region of the base cell layout pattern.

Another aspect of the invention relates to a method of forming a layout definition of a semiconductor integrated circuit. The method includes selecting cells from a cell library, which has at least one base cell and at least one corresponding derivative cell having an identical logical function as the base cell. The base cell and the derivative cell each include a layout pattern. The layout pattern of the derivative cell has a wider transistor geometry than the layout pattern of the base cell. The selected cells are arranged in a semiconductor layout pattern and interconnections between the arranged cells are routed. Loading of the arranged cells is determined based upon the routed interconnections.

Another aspect of the present invention relates to a semiconductor cell library having a plurality of semiconductor cell definitions. At least one of the semiconductor cell definitions includes a base cell definition and a derivative cell definition. The base cell definition has a logical function and a base cell layout pattern of transistors. The derivative cell definition has the same logical function and a different transistor geometry as the base cell definition.

BRIEF DESCRIPTION OF THE DRAWINGS

FIG. 1 is a diagram of a cell layout pattern according to one embodiment of the present invention.

FIG. 2 is a diagram illustrating a partial integrated circuit layout pattern having a plurality of densely packed rows.

FIG. 3 is a diagram of a partial integrated circuit layout pattern having a plurality of rows, which are moved apart from one another as compared to the rows in FIG. 2.

FIG. 4 is a diagram illustrating a layout pattern row in which a base cell and a plurality of its wider derivative cells have been placed.

FIG. 5 is a flow chart of a layout process according to one embodiment of the present invention.

DETAILED DESCRIPTION OF THE PREFERRED EMBODIMENTS

The present invention provides a library of semiconductor cells for use during a layout process of an integrated circuit. The library is capable of providing both high performance and high transistor density. In one embodiment, the library includes a plurality of complementary-symmetry metal oxide semiconductor (CMOS) logic cells. However, the present invention can be used with other technologies.

During the layout process, a schematic diagram or HDL specification of a logical circuit is transformed into an integrated circuit layout definition that can be used for fabrication. Functional elements within the schematic diagram or HDL specification are synthesized into one or more cells that are selected from the cell library. Each cell in the library corresponds to a particular functional unit. The functional units provide basic building blocks for more complex logical functions. For example, basic cell functions include AND, NAND, OR, NOR, inverter and buffer functions.

The cell library includes a cell layout definition and cell characteristics for each cell in the library. The cell layout definition includes the cell layout pattern, the geometry data for the transistors in the cell and local cell routing data. The cell characteristics include timing characteristics and a model of the cell's logical function. The cell library definition is used during the layout process of the integrated circuit to form part of the overall integrated circuit layout definition and for performing timing and functional simulations.

FIG. 1 is a diagram of a cell layout pattern 10 for a CMOS two-input NAND gate, which is arranged along X-axis 12 and Y-axis 14. Layout pattern 10 includes cell boundary 16, conductive metal layer segments 18–20, conductive local cell interconnect segments 21–27, P$^+$-type diffusion region 30 (with N$^+$ well not shown), N$^+$-type diffusion region 32, polysilicon segments 34 and 36 and "vias" 40–46. Metal layer segment 18 forms a relatively positive voltage supply rail VDD while metal segment 19 forms a relatively negative voltage supply rail VSS.

Four transistors are formed on diffusion regions 30 and 32, including PMOS transistors 50 and 52 and NMOS transistors 54 and 56. The gate of each transistor is defined by the region at which polysilicon layers 34 and 36 overlap diffusion regions 30 and 32. The width (or "height" in FIG. 1) of the gate is defined by the extent of the overlay, which determines the drive capability of each transistor. In the embodiment shown in FIG. 1, transistors 50 and 52 have a width 60 while transistors 54 and 56 have a width 62. The terms "width" and "height" are interchangeable terms and their use depends on the particular naming convention adopted. The overall cell has a cell height 74, a cell width 76 and a geometric center 78.

Polysilicon layers 34 and 36 form the two input terminals of the NAND gate while metal layer 20 forms the output terminal. Vias 40–46 indicate connections between layers in the cell. Voltage supply rail 18 is coupled to local interconnect segments 21, 22 and 24 through vias 40–42, respectively. Local interconnect segments 21, 22 and 24 are, in turn, coupled to diffusion region 30. Voltage supply rail 19 is coupled to local interconnect segments 25 and 26 through vias 43 an 44, respectively. Local interconnect segments 25 and 26 are, in turn, coupled to diffusion region 32. Via 45 connects local interconnect segment 23 to metal layer segment 20, and via 46 connects local interconnect segment 27 to metal layer segment 20. Local interconnect segments 23 and 27 are coupled to diffusion regions 30 and 32, respectively.

As the overall integrated circuit layout pattern is being formed, instances of selected cells in the library are placed in rows within the layout pattern, and the interconnections between the placed cells are routed along predetermined routing paths.

FIG. 2 is a diagram illustrating a partial integrated circuit layout pattern 80 having a plurality of densely packed rows 82–84 in which several cell instances have been placed. Rows 82–84 extend along X-axis 86 and are spaced from one another along Y-axis 88. For simplicity, all cell instances in this example are NAND gate cells having the same local cell layout pattern as that shown in FIG. 1. For example, cell instances $10_0$, $10_1$, $10_2$ and $10_3$ are placed adjacent to one another in row 82. Rows 82–84 have a row pitch 90, which is substantially equal to the height of each cell, with no additional spacing between the rows. The height of the cells and the row pitch are balanced to achieve a desired density and performance. This is essentially a compromise between two conflicting design goals.

In order to achieve greater performance, at a cost of less density, the rows in a given layout pattern are moved apart to provide greater transistor widths or greater routing space between the rows. FIG. 3 is a diagram of a partial integrated circuit layout pattern 120 having a plurality of rows 122–124, which are moved apart from one another as compared to rows 82–84 in FIG. 2. Rows 122–124 extend along X-axis 126 and are spaced from one another along Y-axis 128. Rows 122–124 have a row pitch 130, which is substantially greater than the height of the cells in the rows. This provides additional areas 132 between each row for routing interconnections between the cells. In terms of transistor density, areas 132 are wasted areas since they contain no transistors. These are areas where the transistors in individuals cells can be widened as routing density and row pitch permit to provide greater drive strength for particular signals, in accordance with the present invention.

In one embodiment, a single cell library is provided and selected cell types in the library have one or more variants with differing transistor widths. For example, selected cell types can have a cell definition with a base cell, which has minimum transistor widths, and one or more derivative cells, which have incrementally wider transistor widths. Derivative cells are available during various stages of the layout process when the row pitch is not minimum to widen selected cell instances as the local routing density permits. The derivative cells have the same logical function as the base cell and substantially the same layout patterns. However, the diffusion regions in the derivative cells are expanded outwardly toward the cell boundaries in the direction of the row pitch.

An example of a base cell $160_0$ and its derivative cells $160_1$–$160_n$, which have been placed adjacent to one another in a single row 162, is shown in FIG. 4. The variable n is a positive integer value greater than zero. The dots shown in FIG. 4 represent a reference grid along X-axis 164 and Y-axis 166. Row 162 has a row axis 163, which passes through the geometric centers of the cells. In FIG. 4, the cell heights and the corresponding diffusion regions 170 and 172 are expanded outwardly in one dimension from row axis 163 by increments of 1/2 grid in derivative cells $160_1$–$160_n$. For example, base cell $160_0$ has a cell height 174 and diffusion region widths 176 and 178. Derivative cell $160_n$ has a greater cell height 180 and greater diffusion region widths 182 and 184.

The underlying architectural rules for cells $160_0$–$160_n$ remain the same as those for base cell $160_0$. Voltage supply rails 190 and 192 have identical routing paths through each of the derivative cells. In addition, each derivative cell has identical boundary rules, diffusion geometries, local polysilicon routing paths, local metal routing paths and via geometries within an area 182 between voltage supply rails 190 and 192. This allows derivative cells $160_1$–$160_n$ to have increased cell heights as compared to base cell $160_0$ while allowing the derivative cells to abut to any other cell in the library within row 162, along X-axis 164. Any rules associated with the top and bottom sides of the cell would be specified relative to the variable cell boundary instead of fixed coordinates. The tallest derivative cell to be supported would be determined by the row pitch or by circuit design constraints given an arbitrarily wide single transistor implemented without folding.

For layout areas that are wire-limited or otherwise have low utilization of cell area, un-utilized areas can be filled by replacing base cells or narrower derivative cells with taller derivative cells having a greater drive strength. The entire netlist can then be reduced because timing requirements can be met without using as many parallel cells, given the greater drive strength of the taller cells. This, in turn, reduces the number of wires required and the resulting design area drops.

Thus, the use of a base cell and a plurality of corresponding derivative cells allows an integrated circuit supplier to support only a single library per technology while enabling the user to achieve both higher density and higher performance. The overall design becomes less of a compromise between these two often competing design goals. By using a single flexible-height cell library, the present invention provides an alternative to multiple libraries that span the density/performance spectrum or single libraries that at best provide a compromise across the density/performance spectrum.

FIG. 5 is a flow chart of a layout process 200 according to one embodiment of the present invention. Layout process 200 includes steps 201–211. The first step in the layout process is to prepare a cell library. The cell library is typically prepared by the manufacturer of the integrated circuit. As mentioned above, each cell in the cell library includes a cell definition having physical data and timing characteristics associated with that cell. One or more of the cell definitions include a base cell and at least one derivative cell in which the diffusion regions are expanded outwardly in one dimension toward the cell boundary relative to the diffusion regions of the base cell.

At step 202, the logic designer prepares a schematic diagram or HDL specification in which functional elements are interconnected to perform a particular logical function. Once the schematic diagram or HDL specification is complete, it is passed to a series of computer aided design tools, beginning at step 203, which assist the logic designer in converting the schematic diagram or HDL specification to a semiconductor integrated circuit layout definition which can be fabricated. The schematic diagram or HDL specification is first synthesized, at step 203, into cells of the cell library defined in step 201.

If the logic designer has no knowledge of or is not interested in row spacing, only the base cells would be available for the first pass through synthesis in step 203. For advanced users, additional, derivative cells would be made available for synthesis based on the row-spacing, with the assumption that all rows are to be cut with the same spacing. If the rows are to be cut with variable spacing, the smallest spacing would determine which derivative cells would be made available for synthesis at step 203. This would ensure that any base cell or enabled derivative cell selected by synthesis could fit in any row during placement.

At step 204, the design tools generate a netlist of the selected cells and the interconnections between the cells. At step 205, the selected cells are placed by arranging the cells in particular locations to form a layout pattern for the integrated circuit. In one embodiment of the present invention, wider derivative cells can be substituted for base cells or narrower derivative cells during placement, as shown at step 206. During placement, output loading for each cell would be estimated based on the netlist generated at step 204 and an estimated placement of the driven cells in step 205.

In typical placement process that is driven by timing concerns, additional cells are placed in parallel with cells having large output loads to provide greater drive strength. Alternatively, new buffer repeater cells are added. However, both of these methods require additional row area that may not be available. With the present invention, a selected cell can be substituted with a wider derivative cell when space is available between the rows. This option would not have the penalty of consuming additional horizontal row area. This substitution can also be performed after placement in step 205, based on actual placement data and estimated routing data.

Once all the selected cells have been placed, the interconnections between the cells are routed, at step 207, along predetermined routing layers. A timing analysis tool is used, at step 208, to generate timing data for electrical signal paths and to identify any timing violations. The timing analysis tool first determines the output loading of each cell based upon the actual routed interconnections of that cell and the input loading of the driven cells. At this time, derivative cells can be substituted for base cells as a function of the output loading of each cell and the available space between the rows that are adjacent to that cell in order to reduce or eliminate timing violations or to achieve a desired performance. Since the layout geometries of each base cell and their respective derivative cells are identical between the voltage supply rails, derivative cells can be substituted for base cells without requiring any rerouting at step 207, except for polysilicon or local metal interconnect routes that extend or are positioned outside the voltage supply rails.

The ability to vary transistor widths on a cell-by-cell basis by substituting derivative cells for base cells during the layout process reduces the number of design iterations required to provide an integrated circuit that has no timing violations and to achieve a desired performance and density. The logic designer no longer has to return to the schematic diagram in order to select a different cell having a higher or lower drive capability. Also, most, if not all, timing violations caused by placement or routing errors can be eliminated by substituting derivative cells for base cells.

At step 205, if there are any timing violations that were not corrected through the cell substitution process, the logic designer can make changes to the schematic diagram or HDL specification, at step 202, update logic synthesis at step 203, change the placement of cells, at step 205, or change the routing, at step 207.

Once all of the timing violations have been corrected, an integrated circuit layout definition is prepared, at step 210, which includes a netlist of the selected cells and the interconnections between the cells. The definition further includes placement data for the cells, routing data for the interconnections between the cells and cell layout definitions. The cell layout definitions include layout patterns of the interconnected transistors, cell routing data and geometry data for the interconnected transistors. The integrated circuit layout definition is then used to fabricate the integrated circuit at step 211.

If the row spacing was not known during the first pass through logic synthesis, at step 203, the row spacing information may be available in subsequent passes. The row spacing information can then be used to determine which derivative cells will be available to help close timing. If a particular integrated circuit is known to have low utilization and thus a large amount of row spacing, all of the derivative cells could be made available for use by the computer aided design tools, including synthesis at step 203. For integrated circuit designs having a high utilization with limited separation between rows, the wider derivative cells would be made unavailable to the synthesis and placement tools.

Given that the width of the voltage supply rails would remain fixed for all cell versions, the frequency of connections to the power supply rails can be increased when rows are pushed apart and wider cells are used in order to satisfy the increased drive strength and higher gate capacitance in the wider cells. If the routing paths that would otherwise be used for increased power strapping are congested, the voltage supply rails could be widened across the entire library of cells as long as local cell interconnect routing in the metal layers is not allowed in areas outside the voltage supply rails. Wider voltage supply rails would allow for less frequent power supply strapping and would provide more area for routing signal lines.

In some embodiments, the $N^+$ wells or $P^+$ wells are formed as a continuous well (or "stripe") across the entire length of the row. When derivative cells are used, the width of the well region within each cell will vary depending upon the width of the cell. The stripe width is therefore determined algorithmically using the well region width of the widest cell contained in the row. The stripe width can therefore vary from row to row.

Also, the widths of the $P^+$ and $N^+$ diffusion regions are not necessarily equal to one another. In a typical CMOS integrated circuit, the P/N width ratio is between 1.0 and 2.0. Therefore, there may be space wasted on the N-type transistor side of the wider derivative cells. If this wasted spaced exceeds 1/2 grid, the boundary along the N-transistor side can be contracted by 1/2 grid, creating a non-symmetrical cell boundary. To take advantage of this feature, the layout pattern of adjacent rows could be "flipped" with respect to one another about the row center lines to provide for less open grids between the N and P sides of the rows.

Although the present invention has been described with reference to preferred embodiments, workers skilled in the art will recognize that changes may be made in form and detail without departing from the spirit and scope of the invention. For example, the term "row" interchanged with the term "column" in the specification and the claims, based upon the particular naming convention used. Similarly, the terms "height", "width", and "length", etc. are interchangeable with one another. The particular cell types shown in the various figures are provided as examples only. Other cell types and other semiconductor technologies can also be used in accordance with the present invention.

What is claimed is:

1. A method of forming a layout definition of a semiconductor integrated circuit, comprising:
   providing a cell library comprising at least one base cell and a plurality of corresponding derivative cells having identical logical functions as the base cell, wherein the base cell and the plurality of derivative cells each comprises a layout pattern and wherein the layout pattern of the derivative cells have wider transistor geometries than the layout pattern of the base cell;
   selecting cells from the cell library during a first logic synthesis pass;
   selecting cells from the cell library during a second, subsequent logic synthesis pass;
   disabling selection of the derivative cells during the first logic synthesis pass;
   enabling selection of the derivative cells during the second logic synthesis pass;
   arranging the selected cells in a plurality of adjacent rows in a semiconductor layout pattern;
   disabling selected ones of the plurality of derivative cells during the second logic synthesis pass based on a spacing between each of the plurality of adjacent rows;
   routing interconnections between the arranged cells; and
   determining loading of the arranged cells based upon the routed interconnections.

2. The method of claim 1 and further comprising substituting one of the derivative cells for the base cell as a function of the loading of the arranged cells during the second logic synthesis pass.

3. The method of claim 1 and further comprising:
   selectively substituting one of the derivative cells for the base cell within the semiconductor layout pattern during the step of arranging the selected cells, based on an estimated output loading on the base cell.

4. The method of claim 1 and further comprising:
   selectively substituting one of the derivative cells for the base cell within the semiconductor layout pattern after the step of arranging the selected cells and before the step of routing, based on a relative placement of the selected cells within the semiconductor layout pattern and estimated routing paths of the interconnections between the arranged cells.

5. The method of claim 1 and further comprising:
   selectively substituting one of the derivative cells for the base cell within the semiconductor layout pattern after the step of routing, based on the routed interconnections between the arranged cells.

6. The method of claim 1 and further comprising defining the base cell and the derivative cells such that:
   the base cell layout pattern comprises first and second voltage supply rail routing paths, which extend parallel to one another through the base cell layout pattern;
   the derivative cell layout patterns comprise first and second voltage supply rail routing paths, which are identical to the first and second voltage supply rail routing paths of the base cell layout pattern, respectively; and
   the layout patterns of the base cell and the derivative cells are identical to one another between the first and second voltage supply rail routing paths.

7. The method of claim 1 wherein the step of arranging comprises:
   arranging the selected cells in a plurality of adjacent rows within the semiconductor layout pattern; and
   defining a continuous well region having a constant width along each row; and
   setting the width of the continuous well region for each row based on the transistor geometry of a widest one of the cells that are arranged in that row.

8. A method of forming a layout definition of a semiconductor integrated circuit, comprising:
   selecting cells from a cell library comprising at least one base cell and at least one corresponding derivative cell having an identical logical function as the base cell, wherein the base cell and the derivative cell each comprises a layout pattern and wherein the layout pattern of the derivative cell has a wider transistor geometry than the layout pattern of the base cell;
   arranging the selected cells in a plurality of adjacent rows in a semiconductor layout pattern;
   defining a continuous well region having a constant width along each row;
   setting the width of the continuous well region for each row based on the transistor geometry of a widest one of the cells that are arranged in that row;
   routing interconnections between the arranged cells; and
   determining loading of the arranged cells based upon the routed interconnections.

* * * * *